United States Patent [19]
Chapron

[11] Patent Number: 4,903,095
[45] Date of Patent: Feb. 20, 1990

[54] INTEGRATED CIRCUIT COMPRISING A DEVICE FOR PROTECTION AGAINST ELECTROSTATIC DISCHARGE

[75] Inventor: Claude E. P. Chapron, Caen, France

[73] Assignee: U.S. Philips Corporation, New York, N.Y.

[21] Appl. No.: 231,636

[22] Filed: Aug. 10, 1988

Related U.S. Application Data
[63] Continuation of Ser. No. 809,632, Dec. 16, 1985, abandoned.

[30] Foreign Application Priority Data
Dec. 21, 1984 [FR] France ................................. 84 19656

[51] Int. Cl.$^4$ ................ H01L 29/78; H01L 29/72; H01L 27/04
[52] U.S. Cl. ................ 357/23.13; 357/34; 357/35; 357/50; 357/65
[58] Field of Search ............ 357/23.13, 50, 65, 35, 357/71, 34

[56] References Cited

U.S. PATENT DOCUMENTS

| | | | |
|---|---|---|---|
| 2,981,877 | 4/1961 | Noyce | 357/53 |
| 3,697,828 | 10/1972 | Oakes | 357/35 |
| 3,890,634 | 6/1975 | Ruegg | 357/35 |
| 4,064,527 | 12/1977 | Shier | 357/50 |
| 4,250,518 | 2/1981 | Bloodworth et al. | 357/35 |
| 4,319,262 | 3/1982 | Bertotti et al. | 357/53 |
| 4,511,912 | 4/1985 | Mahrla | 357/35 |
| 4,821,089 | 4/1989 | Strauss | 357/41 |

FOREIGN PATENT DOCUMENTS

| | | | |
|---|---|---|---|
| 2011701 | 9/1971 | Fed. Rep. of Germany | 357/35 |
| 2494501 | 5/1982 | France | 357/23.13 |
| 55-72081 | 5/1980 | Japan | 357/23.13 |
| 58-43557 | 3/1983 | Japan | 357/23.13 |

OTHER PUBLICATIONS
Fischer et al., "Resistor-Thick Oxide FET Gate Protection Device for Thin Oxide FET", *IBM Technical Disclosure Bulletin*, vol. 13, No. 5, Oct. 1970.
Banker et al., "Lateral NPN Protect Device", IBM Technical Disclosure Bulletin, vol. 23, No. 9, Jul. 1980.
Pease, "Latchup In Bipolar LSI Devices", IEEE Transactions on Nuclear Science, vol. NS-28, No. 6, Dec. 1981.

*Primary Examiner*—Andrew J. James
*Assistant Examiner*—Hgan Van Ngo
*Attorney, Agent, or Firm*—Paul R. Miller

[57] ABSTRACT

The protection device according to the invention is of the type comprising three active regions of alternating conductivity types, whose extreme regions are connected on the one hand to an input to be protected and on the other hand to a supply voltage source of the circuit.

The first active region (2) forms a strip surrounded by the second active region (3). Contact regions (6 and 7) cover the active regions (2 and 3, respectively) and are covered by metallizations (8 and 9), respectively). The contact regions (6 and 7) are separated by thick insulating regions (4). One of the metallizations (8) is connected to the input to be protected and the other metallization (9) is connected to a reference voltage source.

10 Claims, 4 Drawing Sheets

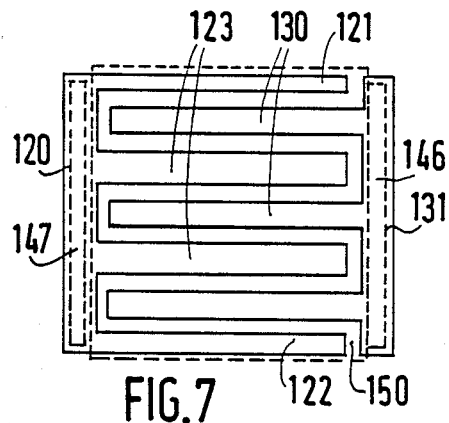
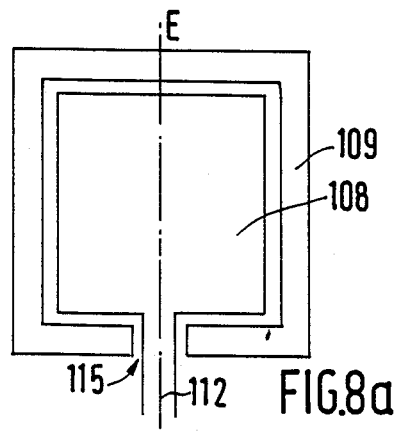
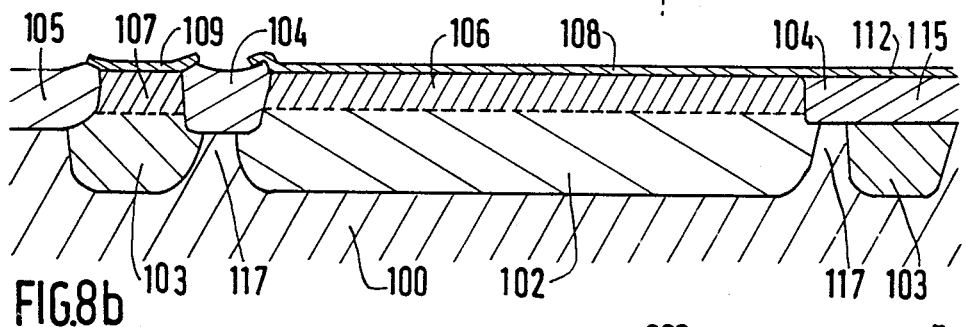
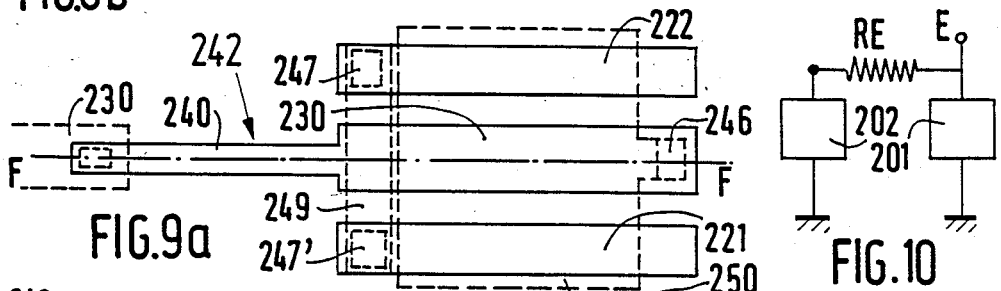
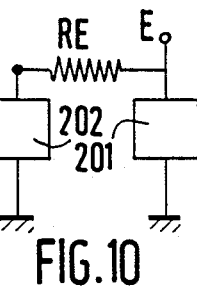
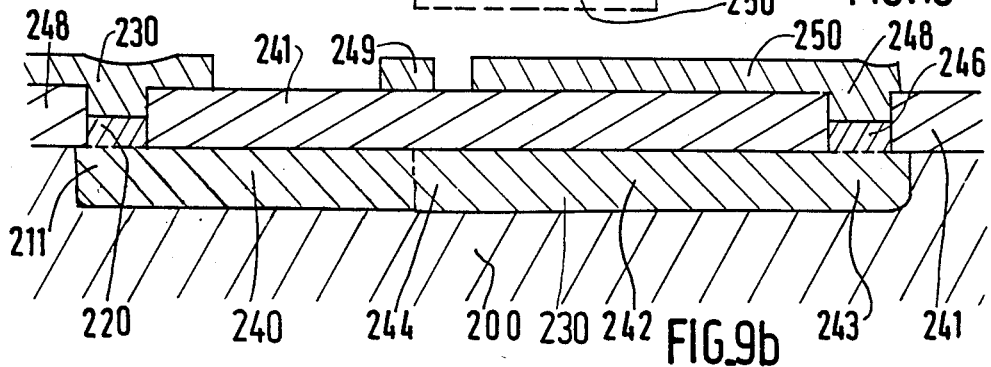

INTEGRATED CIRCUIT COMPRISING A DEVICE FOR PROTECTION AGAINST ELECTROSTATIC DISCHARGE

This application is a continuation application of previous application Ser. No. 809,632, filed Dec. 16, 1985, now abandoned, and all benefits for such earlier application are hereby claimed for this new continuation application.

The invention relates to an integrated circuit having a semiconductor body and comprising a device for protection against electrostatic discharges with the semiconductor body having a substrate region of a first conductivity type and the protection device having a first and a second active region of a second conductivity type which are laterally spaced and which adjoin the substrate region. The first active region is connected to a first conductive layer to be protected, and the second active region is connected to a second conductive layer for connection to a reference voltage source with the first and second active regions being separated by a third active region which is formed by a portion of the substrate region. A first thick insulating layer which over at least part of its thickness is inset in the semiconductor body and a second thin insulating layer is present with the first insulating layer extending into the semiconductor body to a first depth and covering the third active region between the laterally spaced first and second active regions.

Such a circuit is known from European Patent No. 57 024. In this Patent, the first and second active regions are formed between regions of thick oxide and are covered only by regions of thin oxide, through which electrical contact windows have been provided. These regions of thin oxide do not withstand large potential differences, and particularly not the potential differences corresponding to electrostatic discharges.

Consequently, the protection device, which by definition is susceptible to receiving large potential differences, is not sufficiently electrically insulated from the surface of the circuit.

The regions of thin oxide covering the first and second active regions are weak with regard to electrical isolation. For example, it is absolutely impossible to cover a region of thin oxide by a metallization other than that for contacting the active region covered by it.

The invention has for its object to provide an integrated circuit which does not exhibit these disadvantages. In this circuit, the three active regions of the protection device are in fact not covered at any area by a thin oxide. In this case, the protection device is completely isolated electrically with respect to the surface of the circuit and no deterioration of the oxide need be feared in the case of electrostatic discharges.

For this purpose, the integrated circuit according to the invention is characterized in that the first and second active regions are present in the semiconductor body at a larger depth than the first depth and each have a first and a second portion with each of the first portions of the first and second active regions being covered by a first and a second contact region, respectively, of the second conductivity type with the first and second contact regions being covered by the first and second conductivity layers, respectively, and with the second portions of the first and second active regions being covered by the first thick insulating layer.

The substrate region can be doped more weakly than the first and second active regions, which permits minimizing the value of the parasitic capacitances.

The first and second contact regions may advantageously form part of an epitaxial layer of the second conductivity type.

According to a modification, the device adjoins a metallization layer of the input to be protected. For this purpose, the second active region surrounds completely the first active region, the second contact region covers the second active region but for a region forming an insulating bridge and the first conductive layer has a first contact strip passing over the insulating bridge in such a manner that a connection with an input circuit to be protected is established.

According to a further modification, the first conductive layer comprises a first metallization layer, the second active region surrounds the first active region, the second contact region covers the second active region but for a region forming a second insulating bridge and the first conductive layer has a second contact strip passing over the second insulating bridge in such a manner that a connection with an input circuit to be protected is established.

For one or the other of these modifications, the second conductive layer can have a third contact strip arranged for the purposes of establishing the connection to a reference voltage source. Preferably, the first and second conductive layers entirely cover the first and second contact regions, respectively.

According to a preferred modification, the device is situated for the major part beneath a metallization layer corresponding to the input to be protected, which permits obtaining the double supplementary advantage on the one hand of a saving of area and on the other hand of a reduction of the parasitic capacitance by substitution of the capacitance of the layer.

For this purpose, the first thick insulating layer is constituted by an insulating layer portion which covers the major part of the surface of the active regions and is itself covered by a second metallization layer but for a region adjoining the second conductive layer, while the second metallization layer comprises a first part which electrically connects the second metallization layer to the first active region.

According to an embodiment of this modification, the first and second conductive layers are arranged opposite to each other and the active regions are arranged interdigitally.

For this purpose, the first active region comprises on the one hand $2n-1$ active branches with $n \geq 1$ and on the other hand a first electrical connection portion, especially a first active strip interconnecting for $n > 1$ ends of the $2n-1$ branches and constituted for $n = 1$ by an end of the branch of the first active region, while the second active region has on the one hand $2n$ active branches and on the other hand a second electrical connection portion, especially a second active strip, interconnecting ends of the $2n$ branches with the branches of the first and second active regions being arranged interdigitally and the first and second electrical connection portions are connected to the first and second conductive layers, respectively, in such a manner that the first part bounds the remaining part of the second metallization layer, which is thus available for electrically connecting the input to be protected.

On the other hand, a uniform distribution of the currents can be obtained in that the outer branches of the second active region are given a width equal to half that of the branches of the first active region and of the other branches of the second active region.

For n=1, the second active region may be in the form of a U and its branches advantageously have a width equal to half that of the first active region.

According to a second embodiment of this modification, the device includes a series resistor between the input metallization layer and the corresponding input circuit.

For this purpose, the first active region has on the one hand $2n-1$ active branches with $n \geq 1$ and on the other hand a first electrical connection portion, especially a first active strip, interconnecting for $n > 1$ ends of the $2n-1$ active branches and constituted for $n=1$ by an end of the branch of the first active region with the second active region having $2n$ active branches. The active branches of the first and second active regions are arranged interdigitally and the $2n$ active branches of the second active region are electrically interconnected with at least one active branch of the first active region being prolonged on a side opposite to the side at which the first electrical connection portion is located. This is preferably accomplished by crossing the second conductive layer, which then electrically interconnects the $2n$ active branches of the second active region from which it is then isolated by the insulating layer portion by a buried prolonged part of the same conductivity type as the first active region whose free end is connected to an input stage of the input to be protected with the aid of a contact region with the prolonged part thus forming the series resistor.

In order that the invention may be readily carried into effect, it will now be described more fully, by way of example, with reference to the accompanying drawings, in which:

FIG. 7 shows an interdigitated modification of the preferred embodiment;

FIGS. 8a and 8b show in plan view and in vertical sectional view, respectively, a further embodiment of the invention;

Figure 11:
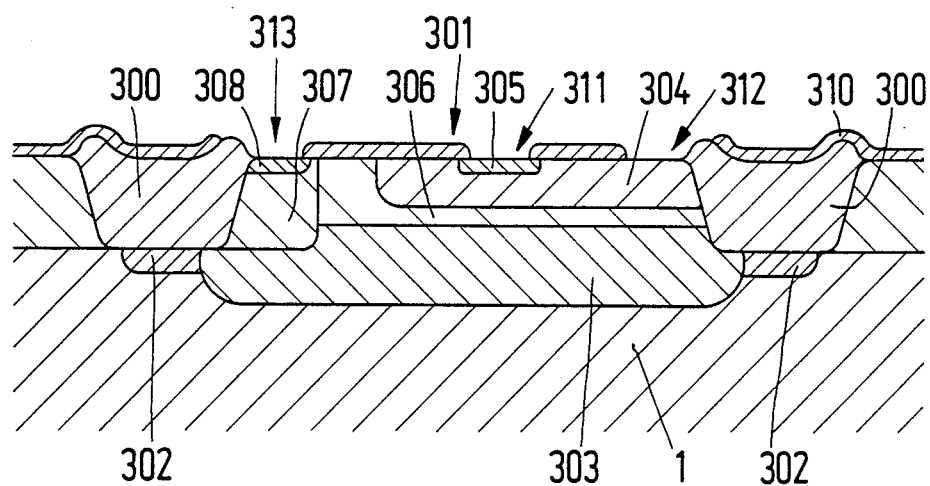

FIGS. 9a and 9b show in plan view with representation in dotted lines of the contour of the metallizations and in vertical sectional view, respectively, another modification of the second embodiment, FIG. 10 shows a corresponding electronic circuit diagram; and FIG. 11 shows a part of an integrated circuit having an epitaxial layer and a thin and a thick oxide according to the so-called "Subilo" technique.

Figures 1A, 1B:
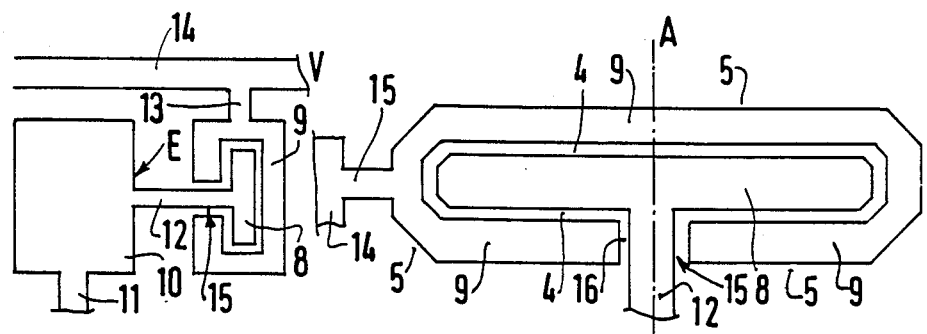
FIGS. 1a and 1b show in plan view a first embodiment of the device according to the invention and a detail thereof, respectively.

According to FIGS. 1a and 1b, an input E to be protected has a metallization layer 10 intended for its electrical connection, a line 11 for electrical connection with its input stage and a contact strip 12 forming a contact with a metallization 8 in the form of a strip. A metallization 9 surrounds the metallization 8 but for a duct 15 leaving free passage for the contact strip 12.

The metallization 9 has a leg 13 forming a contact with a line 14 supplied with a reference voltage, i.e. a supply voltage V of the circuit or ground voltage.

There is present between the metallizations 8 and 9 an insulating layer 4 of, for example, $SiO_2$ known per se for the lateral isolation of the components, which is prolonged at 16 into the duct 15. The metallization 9 is advantageously bounded along its outer periphery by an insulating layer 5 of, for example, $SiO_2$ which is joined with the insulating region 16.

Figure 2:
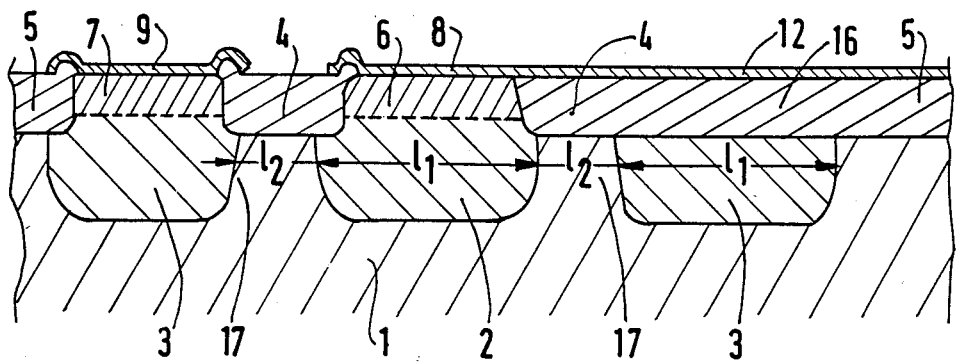
FIG. 2 is a vertical sectional view AA of FIG. 1b.

According to FIG. 2, the integrated circuit has a substrate 1 of, for example, Si, which is preferably weakly doped, and which is of a first conductivity type, for example, the p-type, and two buried layers 2 and 3 of the second conductivity type opposite to the first conductivity type, i.e. the n-type in the example, and which are preferably highly doped. A layer 6 of the second conductivity type generally obtained by epitaxy is provided on the buried layer 2 in such a manner that it forms a contact region, whose doping level is not critical and which ensures an electric continuity between the buried layer 2 and the metallization 8 covering it. A layer 7 of the second conductivity type generally also obtained by the same epitaxy is provided on the buried layer 3 in such a manner that it forms a contact region for the metallization 9 covering it. The insulating layer 4 surrounding the metallization 8 and the contact region 6 and prolonged at 16 into the region of the duct 15 is deeper than the layer 6 and limits the upper edges of the buried layer 2 and the inner upper edge of the buried layer 3. The buried layers 2 and 3 are separated by narrow portions 17 of the substrate 1, with which they form three contiguous regions of alternating conductivity types, which are active for the protection of the circuit.

In a general sense, the term "contact region" is to be understood to mean any region contiguous to an active buried region suitable to form an electrical contact with a metallization covering it. It will be clear that in this case a supplementary region obtained by epitaxy is described only by way of example. By way of variation, the contact region contiguous to an active region may be constituted by a portion of the surface of the substrate, on which the metallization is provided.

The insulating layer 5 of the same depth as the layer 4 limits the upper outer edge of the buried layer 3 and forms an isolation island for the protection device. It is joined with the portion 16 in the region of the duct 15. The insulating layer 5 generally forms part, as shown, of a deep oxide layer present at selected areas.

Figure 3:
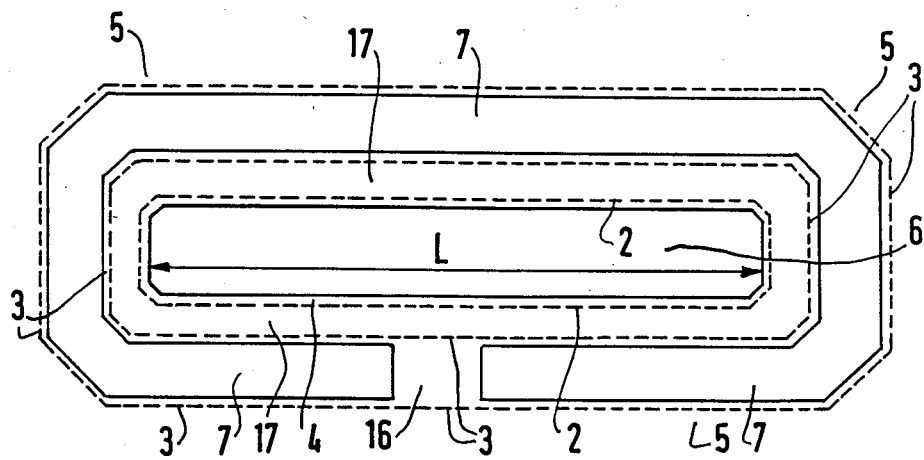
FIG. 3 is a plan view of FIG. 2 with the metallizations being removed.

In FIG. 3, the edges of the buried layers 2 and 3 are indicated by dotted lines and these buried layers are obtained by diffusion through a mask before the insulating layers 4 and 5 are formed and extend below these layers over a certain distance. The distance between the dotted lines 2 and 3 corresponds to the narrow portion 17 of the substrate 1. The insulating region 16 bridges the regions 4 and 5 in the region of the duct 15, which permits the passage of the conductive leg 12.

By way of example, such a protection device has been formed on a $p^-$ substrate having a resistivity of $10\Omega.cm$ (doping of the order of $10^{16}$ atoms/cm$^3$), the buried layers 2 and 3 of the n-type having a sheet resistance of the order of $30\Omega$ per square. The depth of the layers 4 and 5, called deep oxide according to a frequently used form of the technique and which consist of $SiO_2$, is of the order of 1.5 $\mu m$, which enables these layers withstand potential differences such as occur in the electrostatic discharges. The narrow portion 17 of the substrate has a width $l_2$ of the order of 5 μm and the buried layers 2 and 3 have a width $l_2$, of the order of 10 μm. The length L of the buried layer 2 in the form of a strip is of the order of 50 to 100 μm. This device is able to ensure a protection with respect to electrostatic voltages of the order of a few kV originating from the discharge of the human body.

In a general sense, the three active regions 2, 17 and 3 in all probability are susceptible to operating as a bipolar transistor of low amplification performance and in the avalanche mode with the operation depending upon the dimensions, the dopings and the polarities of the active zones. The thickness of the layer 4 permits the contact strip 12 to be electrically isolated from the active regions 3 and 17 even during an electrostatic discharge.

Figures 4A, 4B:
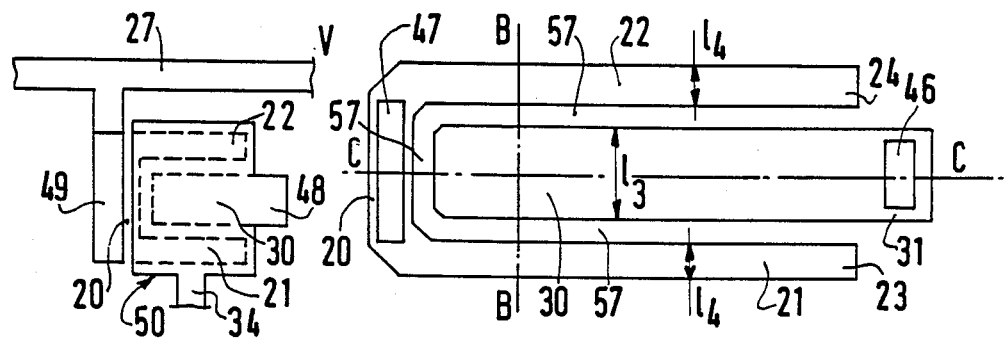
FIGS. 4a and 4b show in plan view a preferred embodiment of the device according to the invention and a detail thereof, respectively.
Figure 5:
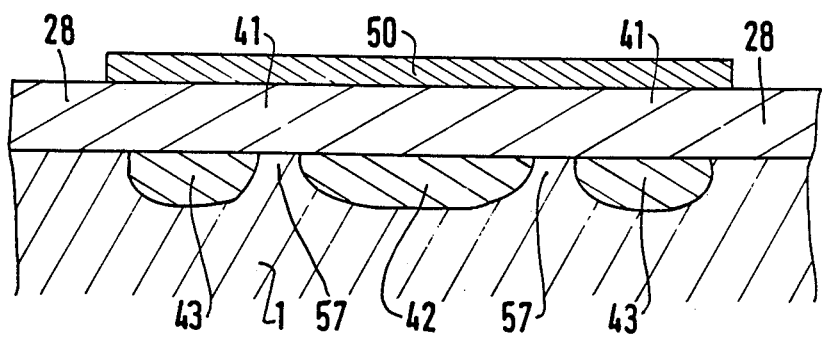
FIGS. 5 and 6 show the vertical sectional views BB and CC, respectively, of FIG. 4b.

According to FIGS. 4a, 4b and 5, the protection device is buried almost entirely under the metallization 50 of the input to be protected, from which it is separated by a portion 41 of an insulating layer 28. A first buried layer 42 of the conductivity type opposite to that of the substrate forms a strip 30 surrounded by a second buried layer 43 also of the conductivity type opposite to that of the substrate 1. The first (42) and second (43) buried layers, which constitute two active regions, are covered by contact layers 46 and 47, respectively, preferably obtained by epitaxy, only at the areas used for forming contacts. Between the two active regions 42 and 43, a region 57 of the substrate constitutes the third active region. It is of course possible that the buried layer 43 surrounds completely the first buried layer 42. However, according to the preferred modification shown, the second buried layer 43 forms a U, whose branches 21 and 22 enclose the strip 30 forming the first buried layer 42, the end 31 of the latter being available for forming a contact 48 through a window of the insulating layer 28 between the metallization 50 and the contact layer 46. In this manner, the major input contact surface of the metallization 50 is prolonged by the contact area 48. The bar 20, which connects the branches 21 and 22 of the U, is situated at least in part beyond the metallization 50 so that it may receive a metallization 49 connecting through a second window of the insulating layer 28 the contact layer 47 to a voltage supply bar 27 of the circuit.

The insulating layer 28 of, for example, SiO$_2$ has a larger depth than that of the layers 46 and 47 so that it limits the upper edges of the buried layer 42 and of the buried layer 43 and forms an isolating island for the assembly of the protection device. A narrow portion 57 of the substrate is situated between the buried layers 42 and 43.

In order to obtain a uniform distribution of the currents, the active region 42 can be given a width $l_3$ equal to twice that ($l_4$) of the active region 43.

Figure 6:
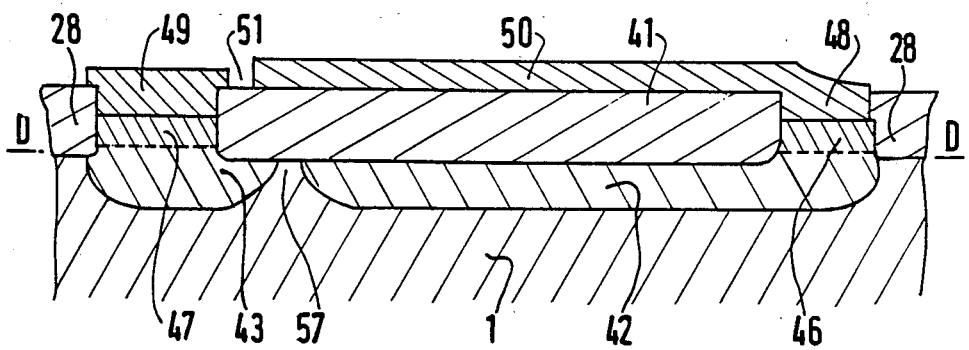

According to FIG. 6, the insulating layer 41 has two windows, one being present on the bar of the U for receiving the metallization leg 49 and the other being present at the level of the end 31 of the strip 30 for receiving the metallization leg 48 bounding the metallization surface 50.

As in the case of the preceding modification, the active regions 42, 43 and 57 act as a bipolar transistor in the avalanche mode. The oxide layer 41 has a thickness sufficient to isolate aspecially the metallization 50 of the active regions 43 and 57, even in the case of electrostatic discharges.

According to FIG. 7, the strip 30 of the preceding Figures is replaced by a plurality of branches 130 interconnected by a strip 131 of the same constitution as the branches 130 and carrying over a major part of its length a contact layer 146 (indicated by dotted lines) coated with a metallization (not shown) prolonging a metallization surface 150 (indicated by dotted lines). Branches 123 interconnected through a strip 120 of the same constitution as the latter are interdigitated with branches 130 and their extreme branches 121, 122 have a width equal to half that of the other branches 123 in order to obtain the advantage of a uniform distribution of the currents.

It should be noted that the electrical connection between the branches can be established by any means, especially only by a metallization or only by a strip of the same constitution as the branches.

The third modification (FIGS. 8a and 8b) is similar to the first modification, except for the dimension of the metallization 108, which is such that it constitutes the metallization surface of the input to be protected. It is connected to the corresponding input circuit by a leg 112 passing over an insulating bridge 115. According to FIG. 8b, the device comprises a substrate 100 weakly doped by a first conductivity type and two buried layers 102 and 103 of the second conductivity type opposite to the first conductivity type. A layer 106 of the second conductivity type and generally obtained by epitaxy is provided on the buried layer 102 so that it forms a contact region ensuring an electric continuity between the buried layer 102 and the metallization surface 108 covering it. Likewise, a layer 107 of the second conductivity type generally obtained by epitaxy is provided on the buried layer 103 so that it forms a contact region for the metallization 109 covering it. The insulating layer 104 surrounding the metallization 108 and the contact layer 106 is deeper than the layer 106 and limits the upper edges of the buried layer 102 and the upper inner edge of the buried layer 103 surrounding the latter. The buried layers 102 and 103 are separated by narrow portions 117 of the substrate 100, with which they form three active zones of alternating conductivity types.

FIGS. 9a and 9b relate to an embodiment of the second modification (FIGS. 4a and 4b), but in which the bar of the second buried layer is suppressed, which results in that the latter is reduced to two branches 221 and 222, while the corresponding metallization (49) is maintained (and is now denoted by reference numeral 249).

The first buried layer 242 comprises an active branch 230, which is prolonged on the side opposite to the metallization 248 and the first electrical connection portion 246, by a prolonged buried part 240 crossing the metallization 249 and situated outside the active region, where the two buried layers are arranged opposite to each other, so that a series resistor $R_E$ is formed (FIG. 10) between the metallization surface of the input E and an input circuit 202 corresponding to the input E, the protection device 201 being in turn connected between the metallization surface and ground taken here as reference voltage.

The branches 221 and 222 have two contact layers 247 and 247', respectively, ensuring the electrical continuity between their buried layers and the metallization 249, which itself electrically interconnects the contact layers 247 and 247'. It is to be noted that the crossing mentioned above is only a preferred embodiment. The electrical connection between the layers 247 and 247' may also be obtained by a metallization following the outline of the buried layers or by a direct connection of each of the layers 247 and 247' to ground strips.

More particularly in FIG. 9b, a first layer 242 buried in a substrate 200 comprises at one end 243 a contact layer 246 and at its other end 244 a buried prolonged part 240 generally having the same depth as the buried layer 242. The end 211 of the buried prolonged part 240, which is arranged opposite to the first buried layer 242, is covered by a contact layer 220.

An insulating layer 241 comprises four windows each receiving one of the contact layers 220, 246, 247, 248. The contact layer 246 is coated with a leg 248 adjoining an input metallization surface 250, which covers the three branches 221, 222, 230 of the buried active layers up to a distance from the metallization strip 249 sufficient to ensure an isolation.

It will be appreciated that the device thus described may comprise a larger number of branches.

The embodiments described above are more particularly suitable for the so-called "Locos" or "Subilo" bipolar technique described in French Patent Application No. FR 1 549 386 in the name of the Applicant and its addition 2 081 017.

According to this technique, the buried layers are diffused into a substrate, after which an epitaxial layer is formed, on which by masking exposed portions of the epitaxial layer are removed. An insulation oxide is caused to grow in the openings thus provided and a metallization is realized in a conventional manner after having provided the components of the integrated circuit in the epitaxial layer.

According to FIG. 11, a transistor obtained by means of the above technique is represented after metallization of the contacts. A substrate 1, which may be that of the integrated circuit according to the invention, is of a first conductivity type, for example, the p-type. It comprises a lateral insulation ring 300 of thick oxide having a thickness of about 1.5 μm, which defines an isolated island 301, in which the transistor is formed. The bottom of the isolated island 301 is constituted by a very highly doped buried layer 303 of the second conductivity type, for example, the n+ type.

Before the formation of the thick oxide 300, highly doped regions 302 of the first conductivity type have been formed, whose function is to minimize the leakage currents between islands. It is to be noted that such regions, although they are not shown in the preceding Figures, may nevertheless be present at the periphery of the protection device to fulfill the same function.

The transistor is formed in an epitaxial layer of the second conductivity type. Its collector region 306 is constituted by the subsisting part of the latter after implantation of the base 304 (of the first type), of the emitter 305 (of the second type) and of regions 307 and 308 (of the second type) serving to form collector contacts. A thin insulating layer 310 (having a thickness of about 0.1 μm) is formed on the epitaxial layer and on the thick lateral insulation oxide 300 and has windows 311, 312 and 313 for forming emitter, base, and collector contacts, respectively.

The invention is not limited to the case of bipolar integrated circuits. According to the MOS technology, the thick insulating layer may be constituted by a field oxide of adequate thickness.

What is claimed is:

1. An integrated circuit having a protection device for protecting against electrostatic discharges comprising
   a semiconductor body having a substrate region of a first conductivity type, and an epitaxial layer of a second conductivity type,
   a protection device comprising at least one first active region and at least one second active region of said second conductivity type disposed in said substrate region, said first and second active regions being laterally spaced,
   a first conductive layer to be protected from electrostatic discharges and connected to said first active region,
   a second conductive layer connecting said second active region to a reference voltage source,
   said protection device further comprising at least one third active region formed by a portion of said substrate region and separating said first and said second active regions, said substrate region being more weakly dopend than said first and said second active regions, said first, third and second active regions forming at least three successive active regions of alternate conductivity types of said protection device,
   a first thick insulating layer having a thickness inset in said semiconductor body, said thickness extending to a first depth below a surface of said semiconductor body, said first thick insulating layer covering said third active region,
   wherein said first and said second active regions are disposed in said semiconductor body at a second depth below said surface greater than said first depth, and wherein each of said first and said second active regions have a first portion and a second portion, and
   a first contact region covering said first portion of said first active region and a second contact region covering said first portion of said second active region, said first and second contact regions forming part of said epitaxial layer and extending through the depth of said epitaxial layer,
   wherein said first conductive layer covers said first contact region and said second conductive layer covers said second contact region, and wherein said second portions of said first active region and said second active region are at least partly covered by said first thick insulating layer.

2. An integrated circuit according to claim 1, wherein said second active region completely surrounds said first active region, wherein said second contact region surrounds said first active region except for an insulating bridge region, and wherein said first conductive layer has a contact strip passing over said insulating bridge region to form a connection with an input circuit to be protected.

3. An integrated circuit according to claim 2, wherein said second conductive layer has another contact strip connected to said reference voltage source.

4. An integrated circuit according to claim 1, wherein said first conductive layer includes a first metallization surface, wherein said second active region surrounds the periphery of said first active region, wherein said second contact region covers said second active region except for an insulating bridge region, and wherein said first conductive layer has a contact strip passing over said insulating bridge region to form a connection with an input circuit to be protected.

5. An integrated circuit according to claim 4, wherein said second conductive layer has another circuit strip connected to said reference voltage source.

6. An integrated circuit according to claim 1, wherein said first thick insulating layer includes a portion of an insulating layer covering major portions of surfaces of said first and said second active regions, wherein a metallization layer covers said insulating layer except for a region adjoining said second conductive layer, and wherein said metallization layer includes a portion electrically connected to said first active region.

7. An integrated circuit according to claim 6, wherein said first active region has $2n-1$ active branches with $n \geq 1$ and a first electrical connection portion interconnecting $n > 1$ ends of said $2n-1$ active branches and including for $n = 1$ an end of a branch of said first active region, wherein said second active region has $2n$ active branches and a second electrical connection portion interconnecting ends of said $2n$ active branches, wherein said active branches of said first and said second active regions are disposed interdigitally, and wherein said first and said second electrical connection portions are connected to said first and said second conductive layers so that said first electrical connection portion electrically connected to said first active region bounds remaining portions of said metallization layer.

8. An integrated circuit according to claim 7, wherein $n = 1$ and said second active region is in a U-form having branches enclosing said first active region, and wherein said branches of said second active region have a width equal to half that of said first active region.

9. An integrated circuit according to claim 7, wherein $n > 1$ and said second active region has outer active branches with a width equal to half that of other active branches of said second active region and active branches of said first active region.

10. An integrated circuit according to claim 6, wherein said first active region includes $2n-1$ active branches with $n \geq 1$ and a first electrical connection portion interconnecting for $n > 1$ ends of said $2n-1$ active branches and having for $n = 1$ an end of a branch of said first active region, wherein said second active region has $2n$ active branches interdigitally arranged with said active branches of said first active region, said $2n$ active branches of said second active region being electrically interconnected by said second conductive layer, and wherein at least one active branch of said first active region is prolonged on a side opposite to a side at which said first electrical connection portion is disposed by a prolonged buried part of the same conductivity type as said first active region, said prolonged buried part having a free end connected to an input stage of an input to be protected by a contact region.

* * * * *